United States Patent [19]

Viselli et al.

[11] Patent Number: 5,037,334

[45] Date of Patent: Aug. 6, 1991

[54] CONNECTOR WITH EQUAL LATERAL FORCE CONTACT SPACER PLATE

[75] Inventors: Michael A. Viselli, Elizabethtown; Robert N. Whiteman, Jr., Middletown, both of Pa.

[73] Assignee: AMP Corporated, Harrisburg, Pa.

[21] Appl. No.: 620,976

[22] Filed: Nov. 30, 1990

[51] Int. Cl.$^5$ ............................................. H01R 13/41
[52] U.S. Cl. ....................................... 439/733; 439/79
[58] Field of Search ................... 439/79, 80, 629, 630, 439/733

[56] References Cited

U.S. PATENT DOCUMENTS

| | | | |
|---|---|---|---|
| 3,288,915 | 11/1966 | Hatfield et al. | 174/94 |
| 3,493,916 | 2/1970 | Hansen | 339/17 |
| 3,551,877 | 12/1970 | Telmosse et al. | 339/62 |
| 4,080,041 | 3/1978 | Hawkins, Jr. | 339/196 M |
| 4,225,209 | 9/1980 | Hughes | 339/126 R |
| 4,491,376 | 1/1985 | Gladd et al. | 339/9 E |
| 4,550,962 | 11/1985 | Czeschka | 339/17 LC |
| 4,660,911 | 4/1987 | Reynolds et al. | 339/17 LC |
| 4,697,864 | 10/1987 | Hayes et al. | 439/444 |
| 4,698,025 | 10/1987 | Silbernagel et al. | 439/79 |
| 4,789,346 | 12/1988 | Frantz | 439/80 |
| 4,842,528 | 6/1989 | Frantz | 439/80 |

FOREIGN PATENT DOCUMENTS

175926/83  6/1985  Japan .

Primary Examiner—Eugene F. Desmond
Attorney, Agent, or Firm—David L. Smith

[57] ABSTRACT

There is disclosed a connector (20) including dielectric housing (24) having a mating face (26) and a rear housing face (28) with a plurality of contact receiving passages (32) extending therebetween. A spacer plate (22) extends rearwardly from proximate the rear housing face between first (202) and second (302) flanges. The spacer plate (22) has a plurality of solder tail receiving channels (42) extending forward from the rear face toward the rear housing face for receiving one or more solder tails (40) of contacts (34). The channels (42) define therebetween beams (120 or 122) having detents (70) for seating a solder tail (40). A plurality of contacts (34) are secured in the housing (24). The spacer plate (22) has a first slot (200) between the first flange (202) and a first channel (242) adjacent thereto. The first slot (200) extends substantially parallel to the first channel (242) and is interrupted by a protrusion or bridging member (206) extending between the first flange (202) and the beam (204) between the first slot (200) and the first channel (242). In this manner, the slot is divided into at least two segments (208, 210) with one of the segments (210) extending rearward from the bridging member (206) and the other segment (208) extending forward from the bridging member (206).

30 Claims, 6 Drawing Sheets

CONNECTOR WITH EQUAL LATERAL FORCE CONTACT SPACER PLATE

BACKGROUND OF THE INVENTION

The present invention relates to electrical connectors and in particular to a solder tail alignment and retention system for right angle connectors.

Right angle connectors are typically mounted on a circuit board. A complementary connector mates with the right angle connector in a direction parallel to the circuit board. Contacts in the right angle connector have a mating portion that is parallel to the circuit board and a solder tail that is formed perpendicular to the circuit board on which the connector is mounted. The solder tails are interconnected with circuits on the printed circuit board. The solder tails may be either for surface mount or through hole mount. Surface mount solder tails extend to land interconnected with circuits on the side of the circuit board on which the connector is mounted. Solder tails for through hole mounting extend into plated through holes in the circuit board and are soldered thereto. The array of circuit board through holes or the array of lands for surface mounting have the same pattern and spacing as the solder tails extending from the connector.

Various approaches have been taken to maintain the solder tails in the desired predetermined array configuration. One approach has been to make connector housings in multiple parts, one of which is a locator plate having an array of apertures corresponding to the pattern and spacing of solder tails extending from the mounting face of the connector. After all of the contacts are inserted into the connector housing, the locator plate is passed over the solder tails from the ends thereof and secured to the connector housing as disclosed in U.S. Pat. No. 4,080,041. In this typical spacer plate, each solder tail is received in a respective aperture in the locator plate.

Where the locator plate is integral with the insulative housing of the connector, another approach such as a slotted locator plate may be used. There are variations to this design. With contacts inserted into contact receiving passages in a connector, solder tails may be bent into the slots of the locator plate to form a right angle with respect to the mating portion of the contacts. U.S. Pat. No. 4,210,376 discloses such a right angle connector in which contacts adjacent to their lower ends are provided with retaining lances. The lances are received in recesses in the sidewalls of the channels of the spacer plate to retain the contacts in the channels. When drawn wire contacts are used alternately deep and shallow channels may be used. The channels have extremely narrow entrance portions and enlarged inner ends. The inner ends should be dimensioned to accomodate the wire conductors and the narrow entrance portions should have a width such that the conductors must be forced into the channels.

U.S. Pat. No. 3,493,916 discloses a right angle connector having a plurality of terminals which have a rearward end portion extending through either a first series of relatively long slots or a second series of relatively short slots in a rearwardly extending flange portion of the connector. U.S. Pat. No. 4,491,376 employs a slotted locator plate in which the slots are narrower in width than the solder tails. Each slot is aligned vertically with a contact receiving passage in both rows of contact receiving passages. Each slot has two detents formed by recesses in the otherwise parallel walls of the locator plate slots. The lower row of solder tails is bent about an anvil and forced into the forward detents in the locator plate slots. Subsequently, the upper row of solder tails is bent and forced into the rear detents of the locator plate slots.

U.S. Pat. No. 4,789,346 discloses a right angle connector having a solder post alignment and retention system in which contacts are inserted into all of the contact receiving passages in a row simultaneously. Concurrently therewith the solder posts are inserted into alternate profiled channels in the solder post spacer plate. As the solder posts are inserted into the channels, the portion of the post spacer plate between adjacent channels deflect laterally with a different effective beam length for each row of contacts inserted. The contacts seat in detents in respective channels.

The retention of solder tails in slotted locator plates where that portion of the locator plate between slots deflects laterally when solder tails are inserted, depends on the lateral forces maintained on each solder tail by the spacer plate.

While some spacer plates such as the one disclosed in U.S. Pat. No. 4,789,346 has a substantially rigid portion beside the end channel that receives solder tails such that there is only one flexible member defining an end solder tail receiving channel, other connectors place an unused slot parallel to the end channels that will receive solder tails to provide a flexible member adjacent to the rigid flange. This provides a flexible member at least through a portion of the channel length on both sides of the solder tail receiving channels. However, since there are no solder tails received in the unused slot, the final beam characteristics of the beam between the unused slot and the end channel that receives a solder tail differs from the beam characteristics of a beam between adjacent channels that receive solder tails.

It would be desirable to have an unused slot beside the end channel receiving one or more solder tails such that the resulting beam characteristics of the beam between the unused slot and the channel was substantially the same as the characteristics of beams between adjacent channels that receive one or more solder tails.

SUMMARY OF THE INVENTION

In accordance with the present invention, a dielectric housing having a mating face and a rear housing face has a plurality of contact receiving passages extending therebetween. A spacer plate extends rearwardly from proximate the rear housing face to a rear face and extends laterally between first and second flanges. The spacer plate has a plurality of solder tail receiving channels extending forward from the rear face toward the rear housing face for receiving one or more solder tails of contacts. The channels define therebetween beams having recesses in the sidewalls thereof which in turn define detents for seating a solder tail. Each of the channels has at least one detent therein. A plurality of contacts, each having a mating portion received in one of the contact receiving passages and a solder tail formed to be received in a corresponding channel are secured in the housing. The spacer plate has a first slot between the first flange and a first channel adjacent thereto. The first slot extends substantially parallel to the first channel and is interrupted by a bridging member extending between the first flange and the beam between the first slot and the first channel. The bridging member is positioned along the first slot forward of a detent in the first channel and laterally aligned with a detent in a second channel, the second channel being adjacent to the first channel. In this manner, the slot is divided into at least two segments with one of the segments extending rearward from the bridging member and the other segment extending forward from the bridging member.

DESCRIPTION OF THE PREFERRED EMBODIMENT

Figure 1:
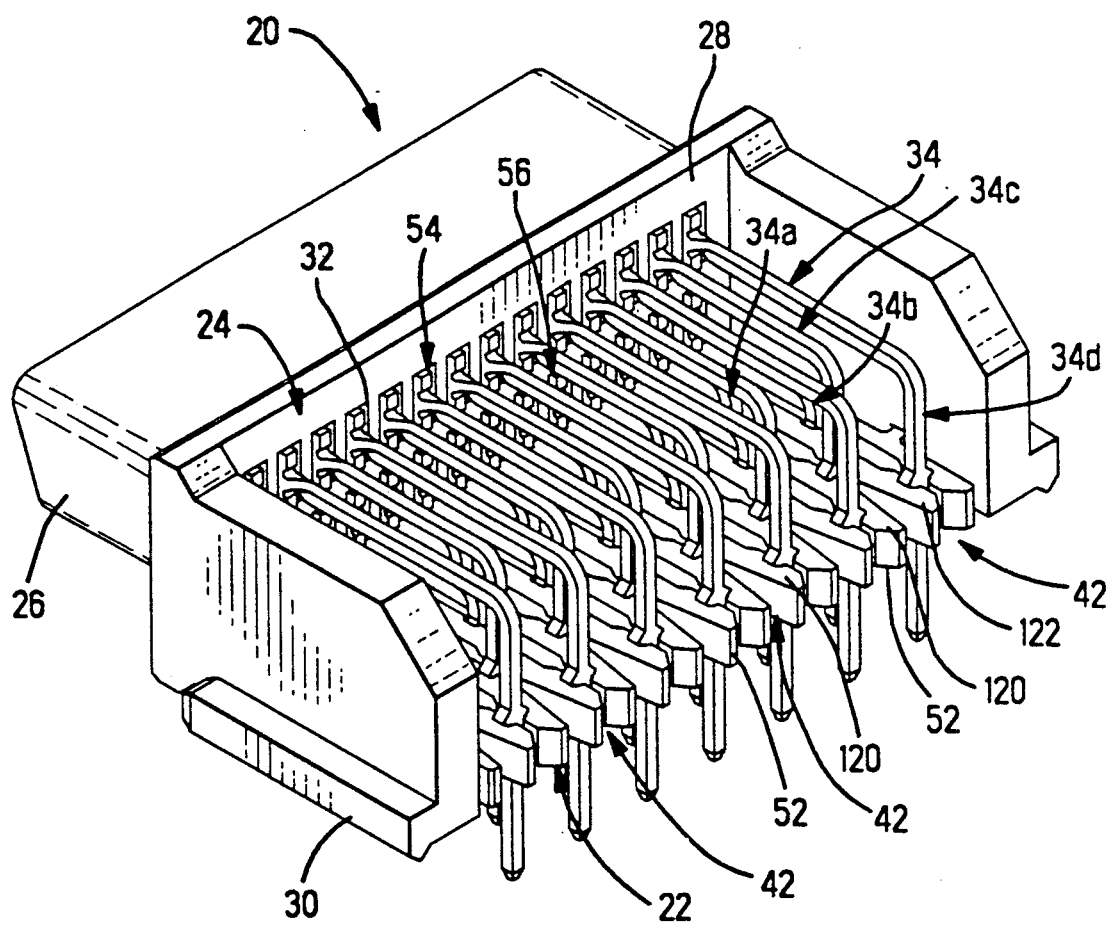
FIG. 1 is a perspective view of a connector including the equal lateral force spacer plate of the present invention.

A connector 20 including an equal lateral force spacer plate 22 in accordance with the present invention is shown in FIG. 1. Connector 20 includes a dielectric housing 24 molded of an appropriate plastic having mating face 26, opposed rear housing face 28 and mounting face 30 at a right angle to mating face 26. A plurality of contact receiving passages 32 extend from mating face 26 toward and opening onto rear housing face 28 with contacts 34 secured therein. Contacts 34 have a mating portion 36 extending into contact receiving passages 32 from rear housing face 28 that may be either pins or sockets and mounting portions 38, typically solder tails 40, that extend rearward from rear housing face 28 then are formed downward at a right angle to extend into and through a channel 42 in spacer plate 22. In the preferred embodiment, spacer plate 22 is molded to be integral with housing 24, although the invention is not limited thereto.

Figure 3:
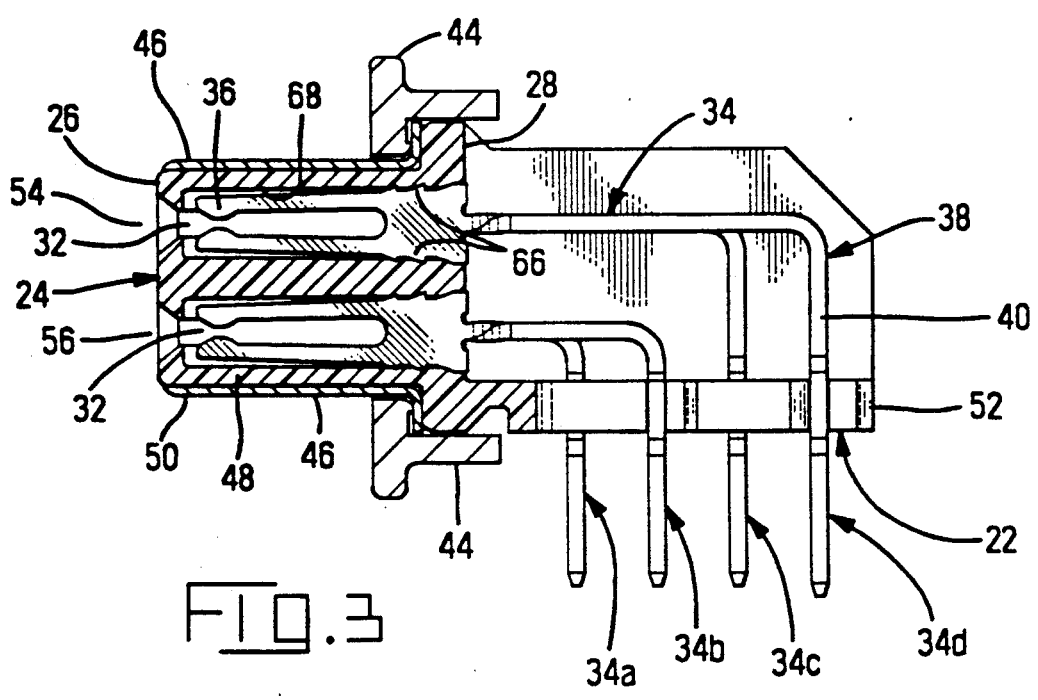
FIG. 3 is a side sectional view of a shielded connector incorporating the present invention.

A shielded version of connector 20 would include an electrically conductive member surrounding at least a portion of housing 24, such as die cast member 44 and drawn shell 46 as shown in FIG. 3. As also seen in FIG. 3, spacer plate 22 is substantially parallel to contact receiving passages 32, is located below the lower row of passages 56 and extends rearwardly from rear housing face 28 of housing 24.

Electrically conductive shell 46 has a similar outer profile to the formed raised portion 48 of housing 24. Shroud 50 extends forward from the die cast member 44 and conforms to and encloses the forward raised portion 48 of housing 24. Shroud 50 may have a trapezoidal or subminiature D shape to provide a polarization feature.

Contacts 34 are formed on a strip on the desired centerline spacing. The contacts are received in two rows of contact receiving passages 54 and 56 and have mounting portions 38 formed to define four rows 58, 60, 62 and 64 of staggered solder tails 40. During fabrication of connector 20, contacts 34 having formed mounting portions 38 are inserted into contact receiving passages 32 from rear housing face 28 substantially as disclosed in U.S. Pat. No. 4,789,346, the disclosure of which is hereby incorporated by reference. As the mating portion 36 is received in passage 32, the solder tail is passed into a respective channel 42 from rear face 52 of spacer plate 22. Mating portion 36 is secured in passage 32 by barbs 66 engaging sidewalls 68 in an interference fit.

Figure 2:
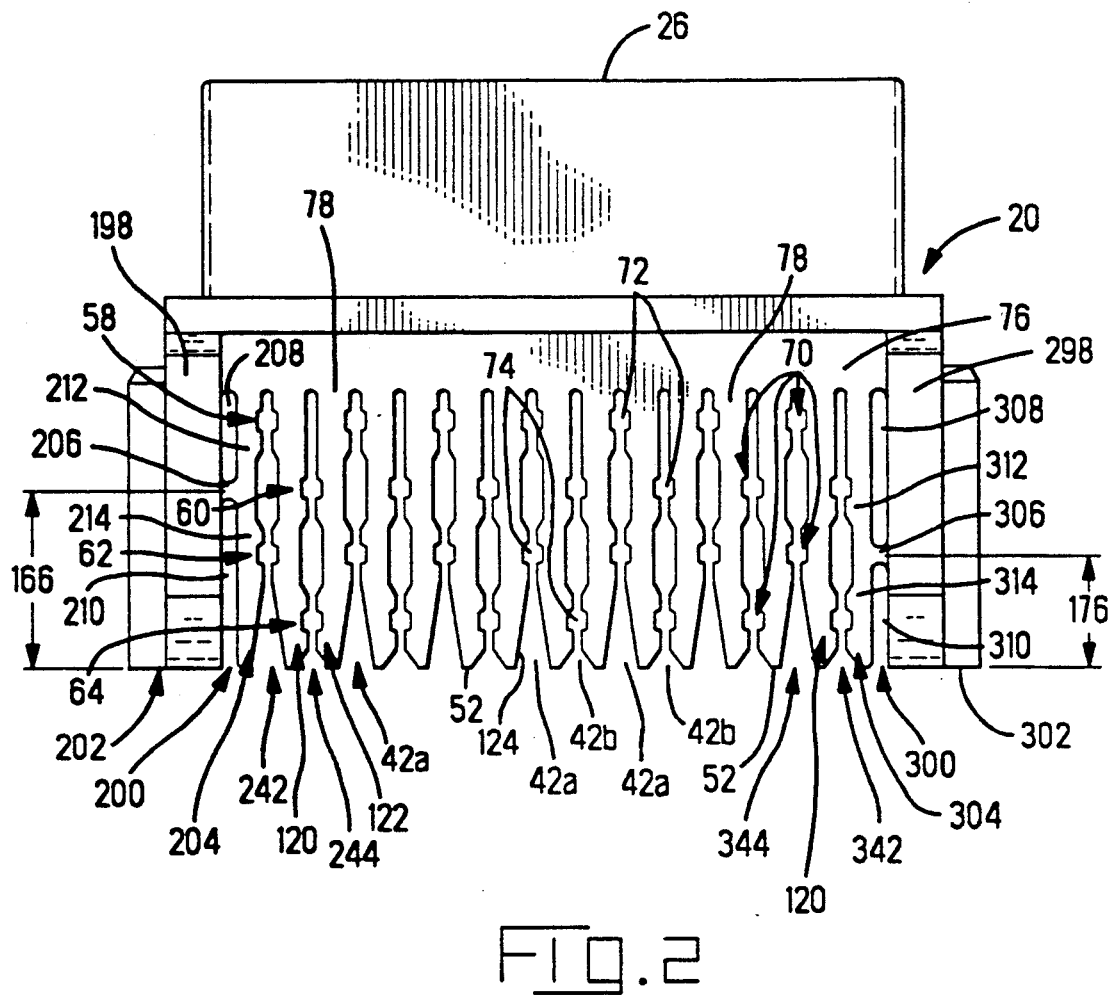
FIG. 2 is a top view of the connector of FIG. 1 with the contacts removed, showing the spacer plate.

FIG. 2 shows a top view of connector 20 without contacts 34 so that spacer plate 22 is more readily visible. Each channel 42 in the preferred embodiment has a pair of spaced detents 70, a forward detent 72 and a rearward detent 74, although the invention is not limited thereto. Each detent 70 in a channel 42 receives a respective solder tail from contacts 34 mounted one each in the contact receiving passages in rows 54 and 56 laterally aligned with channel 42. The staggering of solder tails 40 is achieved by positioning spaced detents 70 closer to rear housing face 28 in alternating channels 42, defining channels 42a than in the alternate channels 42 defining channels 42b. The detents form four rows of detents. All detents in each row of detents are spaced equidistant from rear housing face 28, and since rear face 52 is parallel to rear housing face 28, all detents in each row of detents are spaced equidistant from rear face 52.

Contacts 34, designated contacts 34a when their solder tails are destined to be received in row 58, are pressed into alternate contact receiving passages 32 in the lower row 56 of passages; simultaneously the solder tails 40 of contacts 34a are pressed into respective channels 42a aligned with passages 32 and secured in the forward most detent 72. The solder tails of contacts 34a form row 58.

Next, contacts, designated contacts 34b, are pressed into the remaining alternate contact receiving passages 32 in the lower row 56 of passages; simultaneously, the solder tails 40 of contacts 34b are passed into respective channels 42b aligned with passages 32 and received in the forward most detent 72. The solder tails of contacts 34b form row 60.

Subsequently, contacts designated contacts 34c, are pressed into alternate contact receiving passages 32 in the upper row 54 of passages while simultaneously the solder tails 40 of contacts 34c are passed into respective channels 42a aligned with passages 32 and received in the rearward detent 74. The solder tails of contacts 34c form row 62.

Thereafter, contacts designated contacts 34d, are pressed into the remaining alternate contact receiving passages 32 in upper row 54 of passages; simultaneously, the solder tails 40 of contacts 34d are passed into respective channels 42b aligned with passages 32 and received in the rearward detent 74. The solder tails of contacts 34d form row 64.

Each channel 42 has an opening onto rear face 52 that widens to facilitate insertion of solder tails 40 thereinto. Between channels 42 the spacer plate is formed into beams integral with the spacer plate at forward end 78 thereof and extending to a free distal end proximate rear face 52. Channels 42a widen over a greater length of channel 42 than do channels 42b due to the rearward detent 74 being recessed farther into channels 42a than channels 42b.

Figure 4:
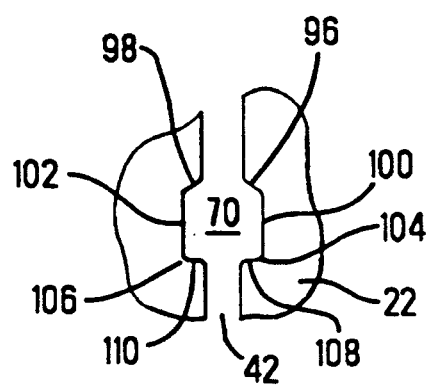
FIG. 4 is a partial plan view, partially in section, showing a detent at a mid-point along a channel in the spacer plate.
Figure 5:
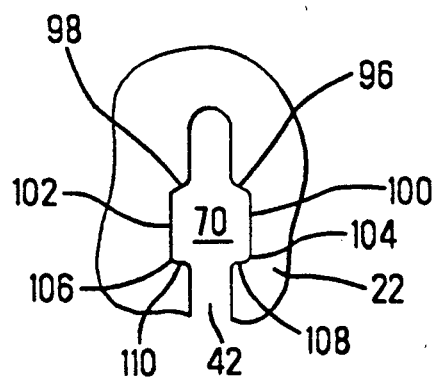
FIG. 5 is a partial plan view, partially in section, showing a detent at the innermost end of a channel in the spacer plate.
Figure 6:
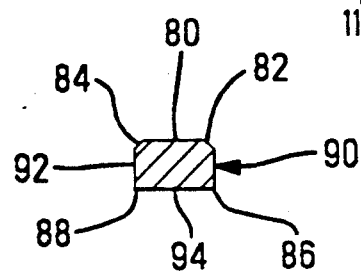
FIG. 6 is a cross section of a solder tail at the plane of the upper surface of the spacer plate.

FIG. 4 shows a typical mid-channel detent 70 in either of channels 42a or 42b in spacer plate 22. FIG. 5 shows a typical forward most detent 72 in channel 42a. FIG. 6 shows the cross section of a solder tail at the plane of the upper surface 76 of spacer plate 22. The leading surface 80 has beveled corners 82, 84 to engage sidewalls of the channels during insertion of solder tails and to facilitate the beams adjacent to the channels to bias or deflect the beams to thereby permit passage of solder tail 40 therebetween. The trailing corners 86, 88 are sharp.

Each solder tail 40 may be secured in a detent 70 by a slight compression fit. A small lateral force may be maintained on each solder tail in a detent to assure that the solder tail is retained therein. Detent 70 is shaped substantially as the cross section of a solder tail 40, as best seen by comparing FIGS. 4 and 5 to FIG. 6.

Figure 7:
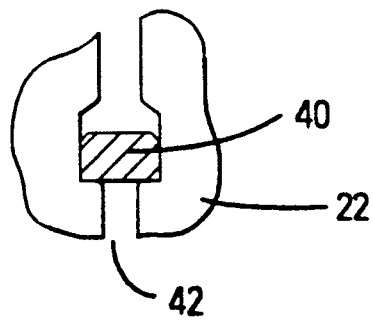
FIG. 7 is the view of the spacer plate shown in FIG. 4 with the solder tail of FIG. 6 received in the detent.
Figure 8:
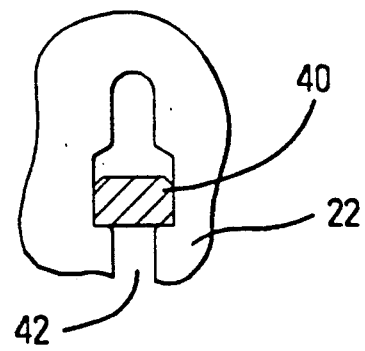
FIG. 8 is the view of the spacer plate shown in FIG. 5 with the solder tail of FIG. 6 received in the detent.

FIGS. 7 and 8 show a solder tail 40 received in detents 70 of FIGS. 4 and 5 respectively. The beveled corners 82, 84 are tapered to engage surfaces 96, 98 of the channel sidewalls as a solder tail is pressed forward through the channel to pass through a detent. Sides 90 and 92 of solder tail 40 substantially engage sidewalls 100 and 102 of detent 70. Trailing corners 86, 88 engage rear corners 104 and 106, which are slightly rounded due to the manufacturing process, in an interference fit. Trailing edge 94 of solder tail 40 is substantially against rearwalls 108, 110.

As best seen in FIG. 2, the spacer plate 22 between adjacent channels 42a and 42b form beams that bias or deflect laterally with an effective beam length when a solder tail 40 is passed into a channel 42 to be secured in a detent 70. Each beam extends from a distal end at rear face 52 forward to the depth of the channels adjacent to the beam where each beam is integral with spacer plate 22 at forward end 78. There are two types of beams, beam 120 and beam 122, defined between adjacent channels 42.

Figure 9:
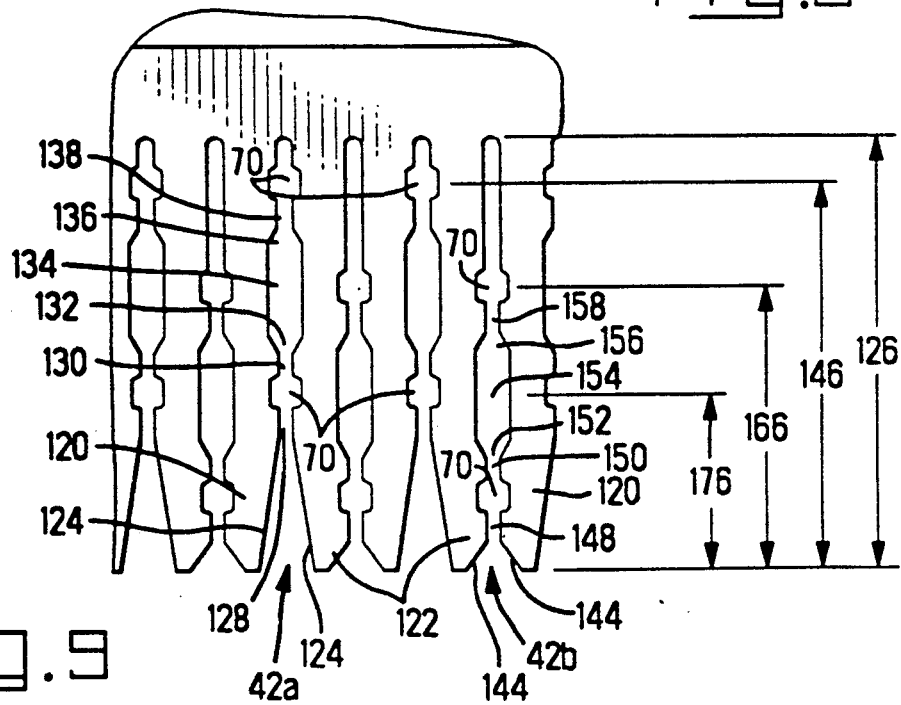
FIG. 9 is an enlarged partial plan view of the spacer plate showing two typical adjacent channels.
Figure 10:
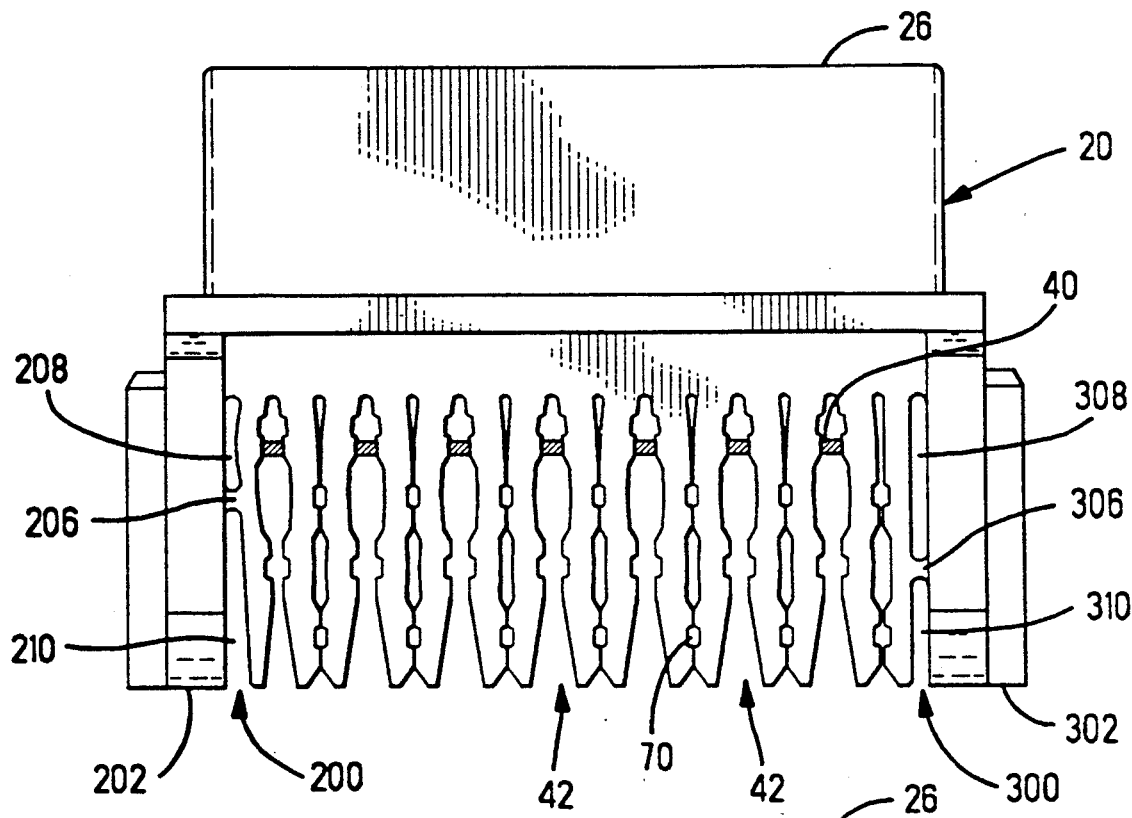
FIG. 10 is a top view of the spacer plate of FIG. 2 with the forward most row of solder tails being passed into the final restriction before seating in a forward detent.

Contacts 34a are the first to be inserted into housing 24. With reference to FIGS. 2, 9 and 10, as contacts 34a are being inserted into a channel 42a, beam 122 is on the left and beam 120 is on the right. As solder tails 40 are passed between tapered lead-in surfaces 124, beam 122 is resiliently deflected laterally to the left and beam 120 is resiliently deflected laterally to the right with an effective beam length for both beams of length 126. Solder tails 40 then enter a first region 128 of channel 42a having substantially parallel walls. Solder tail 40 next enters rearward detent 74 whereupon beams 120 and 122 resile, returning toward their unbiased or undeflected position.

Continued movement of mating portion 36 into passage 32 and passage of solder tail 40 through channel 42a causes beveled corners 82, 84 to react with tapered surfaces 96, 98 of rearward detent 74 to cause beams 120 and 122 to again laterally resiliently deflect or bias with beam 120 deflecting to the left and beam 122 deflecting to the right. These beams still have an effective beam length of length 126.

Solder tail 40 enters and passes through a second region 130 of channel 42a having substantially parallel walls.

Solder tail 40 then passes through a first transition region 132 in channel 42a that widens in the direction of insertion of solder tail 40, which again allows beams 120 and 122 to resile toward their unbiased position. Solder tail 40 then passes into and through a third region 134 of channel 42a having substantially parallel walls. As solder tail 40 passes through the third region, beams 120 and 122 remain in their substantially unbiased position.

Solder tails 40 then pass through a second transition region 136 in channel 42a that narrows in the direction of insertion of solder tails 40. The reaction between the beveled corners 82, 84 and the sidewalls of the transition region 136 cause beam 120 to again resiliently deflect or bias to the left and beam 122 to again resiliently deflect or bias to the right, both with an effective beam length of length 126.

Solder tails 40 then move into and through a fourth region 138 of channel 42a having substantially parallel walls. Solder tails 40 of contacts 34a then enter forward detent 72 of channel 42a whereupon beams 120 and 122 resile, returning toward their unbiased or undeflected position to secure solder tail 40 in forward detent 72.

Figure 11:
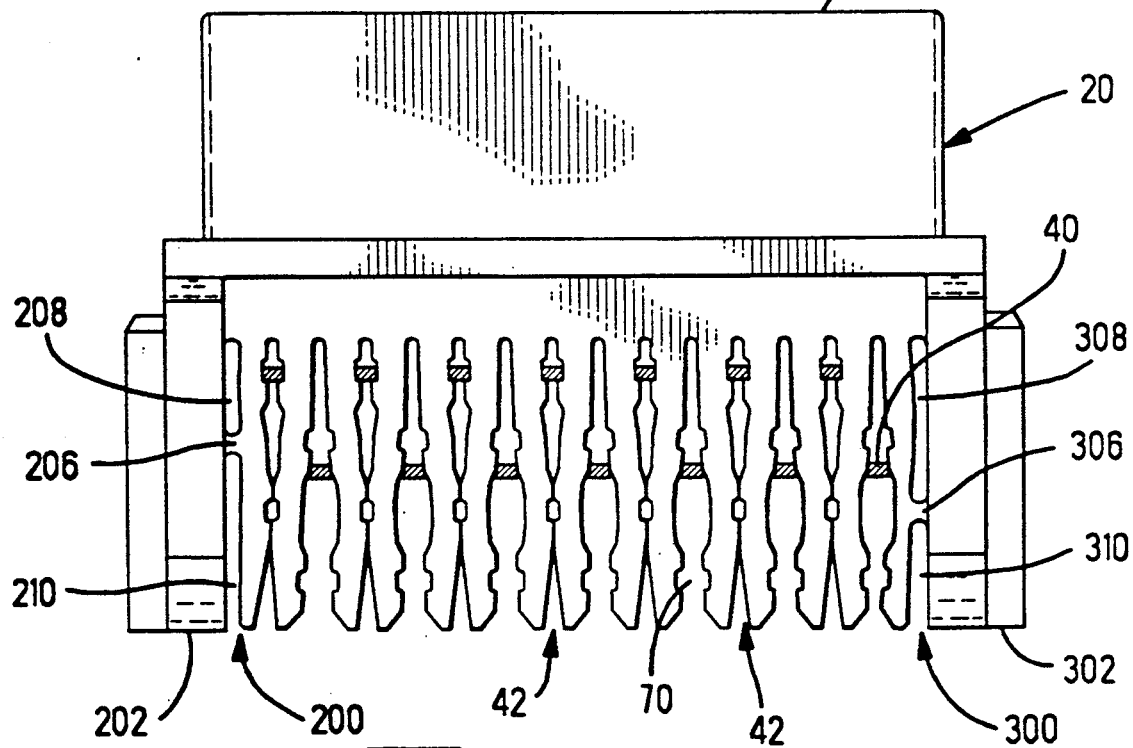
FIG. 11 is a top view of the spacer plate of FIG. 2 with the forward most row of solder tails in detents and the second row of solder tails being passed into the final restriction before seating in a detent.

The next contacts to be inserted into housing 24 are contacts 34b which are inserted into channel 42b. With reference to FIGS. 2, 9 and 11, as contacts 34b are being inserted into a channel 42b, beam 120 is on the left and beam 122 is on the right. At this point in assembly, the solder tails of contacts 34a are secured in detent 72 of channels 42a.

As solder tails 40 are pressed between tapered lead-in surfaces 144, beam 120 is resiliently deflected laterally to the left and beam 122 is resiliently deflected laterally to the right with an effective beam length of length 146 since the solder tails 40 of contacts 34a are in forward detents 72 of the adjacent channels 42a. Solder tails 40 then enter and pass through a first region 148 of channels 42b having substantially parallel walls. Solder tails 40 next enter rearward detent 74 whereupon beams 122 and 120 resile, returning toward their unbiased or undeflected position.

Continued movement of mating portion 36 into passage 32 and passage of solder tails 40 through channel 42b causes beveled corners 82, 84 to react with tapered surfaces 96, 98 of rearward detent 74 to cause beams 122 and 120 to again laterally resiliently deflect or bias, with beam 120 deflecting to the left and beam 122 deflecting to the right, with an effective beam length of length 146.

Solder tail 40 then enters and passes through a second region 150 of channel 42b having substantially parallel walls. Solder tail 40 then passes through a first transition region 152 in channel 42b that widens in the direction of insertion of solder tail 40, which again allows beams 122 and 120 to resile toward their unbiased position. Solder tails 40 then pass into and through a third region 154 of channel 42b having substantially parallel walls.

Solder tails 40 then pass through a second transition region 156 in channel 42b that narrows in the direction of insertion solder posts 40. The reaction between beveled corners 82, 84 and the sidewalls of transition region 156 cause beam 120 to again resiliently deflect or bias to the left and beam 122 to again resiliently deflect or bias to the right, both with an effective beam length of length 146.

Solder tails 40 then move into and through a fourth region 158 of channel 42b having substantially parallel walls. Solder tails 40 of contact 34b then enter forward detent 72 of channel 42b whereupon beams 122 and 120 resile, returning toward their unbiased or undeflected position to secure solder tail 40 and forward detent 72.

Figure 12:
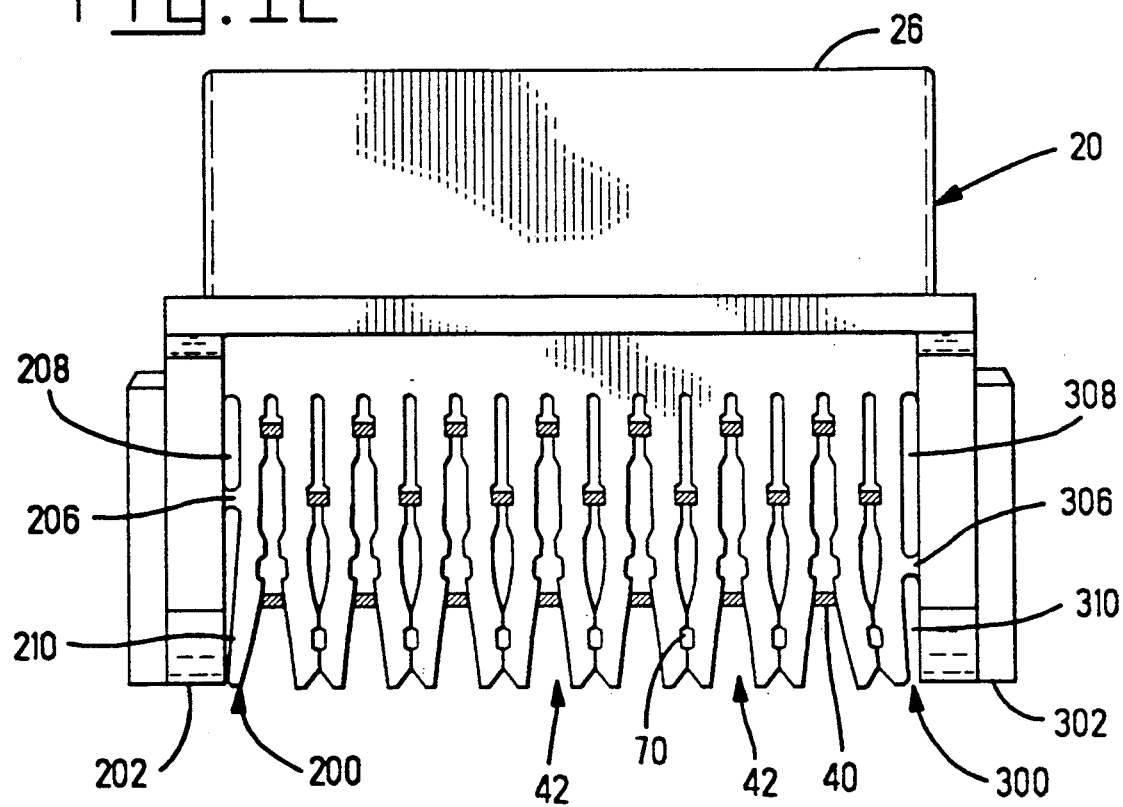
FIG. 12 is a top view of the spacer plate of FIG. 2 with the first and second rows of solder tails in detents and the third row of solder tails being passed into the final restriction before seating in a detent.

The next contacts to be inserted into housing 24 are contacts 32c which are inserted into channels 42a. With reference to FIGS. 2, 9 and 12, as contacts 34c are being inserted into a channel 42a, beam 122 is on the left and beam 120 is on the right.

As solder tails 40 are passed between tapered lead-in surfaces 144, beam 122 is resiliently deflected laterally to the left and beam 120 is resiliently deflected laterally to the right with an effective beam length of length 166 since there is a solder tail 40 of contact 34b in forward detents 72 of channels 42b adjacent to each channel 42a. Solder tails 40 enter first region 128 of channels 42a then pass into rearward detent 74 whereupon beams 120 and 122 resile, returning toward their unbiased or undeflected position to secure solder tails 40 of contacts 34c in rearward detents 74 of channels 42a.

Figure 13:
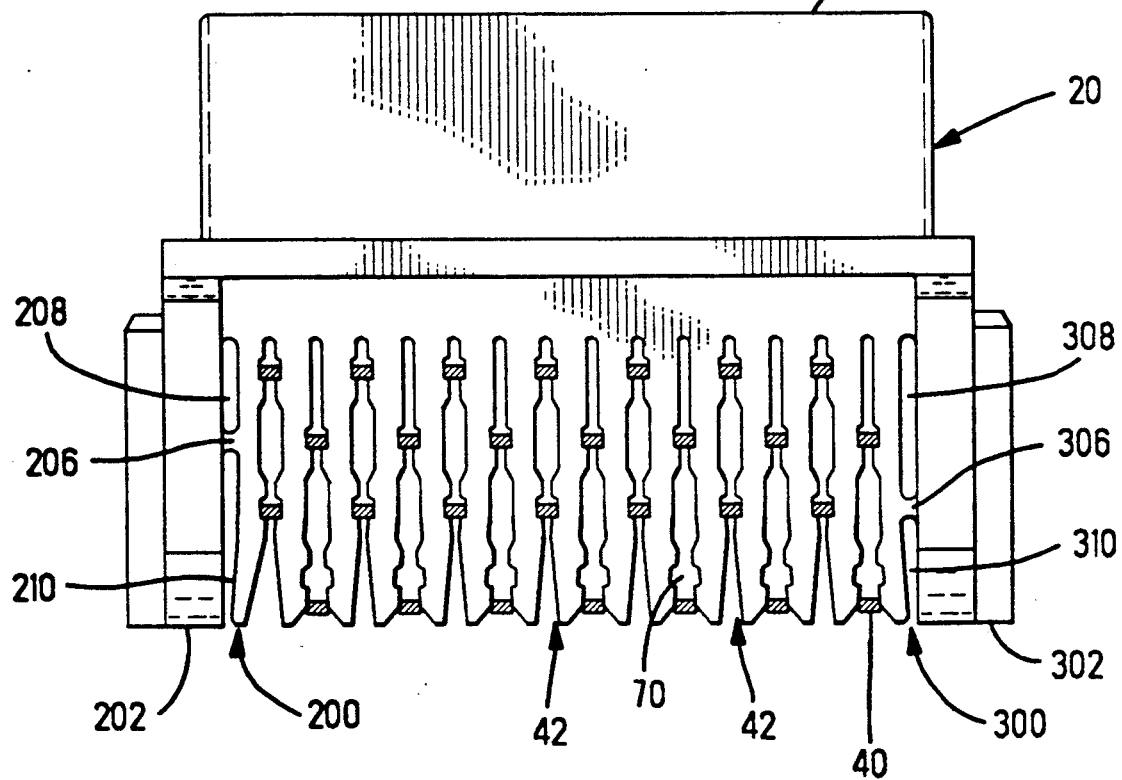
FIG. 13 is a top view of the spacer plate of FIG. 2 with the first, second and third rows of solder tails in detents and the fourth row of solder tails being passed into the final restriction before seating in a detent.

The next and last contacts to be inserted into housing 24 are contacts 34d which are inserted into channels 42b. With reference to FIGS. 2, 9 and 13, as contacts 34b are being inserted into a channel 42b, beam 120 is on the left and beam 122 is on the right. As solder tails 40 are passed between tapered lead-in surfaces 144, beam 120 is resiliently deflected laterally to the left and beam 122 is resiliently deflected laterally to the right with an effective beam length of length 176. Solder tails 40 pass through first region 148 of channel 42b and enter rearward detent 74 whereupon beams 120 and 122 resile returning toward their unbiased or undeflected position to secure solder tails 40 of contacts 34d in rearward detents 74 of channels 42b.

As best seen in FIG. 2, forward detents 72 in channels 42a are laterally aligned and form row 58. Similarly, the forward detents 72 in channels 42b are laterally aligned and form row 60. The rearward detent 74 in channels 42a are laterally aligned and form row 62. Similarly, the rearward detent 74 in channels 42b are laterally aligned and form row 64. In this manner, the two rows 54 and 56 of mating portions of contacts 34 have staggered solder tails forming four rows.

As best seen in FIG. 2, spacer plate 22 has a slot 200 between the final lateral slot 42 and substantially rigid flange 202. The presence of endwall 198 integral with and extending perpendicular to flange 202 enhances the rigidity of flange 202. Slot 200 defines a beam 204 which may be considered a beam 120 or a beam 122 as described above depending upon whether the channel adjacent to slot 200 is a channel 42a or a channel 42b. As shown in FIG. 2, channel 42b is adjacent slot 200 defining beam 204 therebetween. Beam 204 has the characteristics of a beam 122. Absent slot 200, beam 204 would be a portion of flange 202 and would be, like flange 202, substantially rigid.

Beam 204 is bridged to flange 202 at bridging member 206 interrupting slot 200 into forward slot 208 and rear slot 210 and dividing beam 204 into forward beam 212 and rear beam 214. Bridging member 206 is positioned along slot 200 forward of the rearward detent 74, that is spaced away from rear face 52 toward mating face 26, in the adjacent channel 42, laterally aligned with the rearward detent 74 in the channel 42 adjacent to the channel 42 that is adjacent to slot 200. For purposes of discussion, the channel 42 adjacent to slot 200 will be referred to as channel 242 and the channel 42 adjacent to channel 242 will be referred to as channel 244. Thus, bridging member 206 is positioned along slot 200 forward of the rearward detent 74 in channel 242 and laterally aligned with rearward detent 74 in channel 244. In a preferred embodiment, bridging member 206 spans a distance along slot 200 that is substantially the thickness of a solder tail to be received in a detent in one of the channels. In a preferred embodiment, slot 200 extends into spacer plate 22 from rear face 52, substantially parallel to and substantially the same distance as slots 42. Beam 204 has the same mass as beam 122 and in this manner, beam 204 will exhibit the same characteristics as a beam 122 during insertion of solder tails 40 of contacts 34c and 34d of spacer plate 22.

During insertion of the solder tail 40 of contact 34a into slot 242, beam 120 functions as described above. While solder tail 40 is passing between tapered lead-in surfaces 124 and first region 128, beam 204 and more specifically rear beam 214 is resiliently deflected to the left with an effective beam length of length 166 due to beam 204 being bridged to flange 202 by bridging member 206. As solder tail 40 is received in rearward detent 74, rear beam 214 resiles, returning toward its unbiased or undeflected position. As solder tail 40 is moved farther into channel 242 into and through second region 130 and first transition region 132, rear beam 214 is again resiliently deflected to the left with an effective beam length of length 166 then resiles to an unbiased position. Note also that forward beam 212 may flex toward channel 242 since there is no contact in forward detent 70 of channel 242.

As solder tail 40 is moved farther into channel 242, solder tail 40 passes freely through third region 134.

As solder tail 40 enters and passes through second transition region 136 and fourth region 138, forward beam 212 resiliently bows into forward slot 208. Upon solder tail of contact 34a moving into forward detent 72 in channel 242, forward beam 212 resiles toward its unbiased position to secure solder tail 40 in detent 72. A small lateral force may be maintained on solder tail 40 of contact 34a to assure that the solder tail is retained in detent 72.

During insertion of solder tail of contact 34c and channel 242, beam 120 on one side of channel 242 functions as described above and beam 204 on the other side of channel 242 functions like a beam 122 as described above due to solder tail 40 of contacts 34b present in forward detent 72 of channel 244, the design of beam 204 to have the same spring characteristics of beam 122, such as by having the same mass or shape, and the presence and location of bridging member 206 in slot 200. As shown in FIG. 12, when solder tail 40 of contact 34c is received between tapered lead-in surfaces 124 and passes through first region 128, beam 120 is resiliently deflected to the right with an effective beam length of length 166. Simultaneously, beam 204 is resiliently deflected to the left also with an effective beam length of length 166; forward beam 212 is effectively prevented from bowing due to the presence of solder tail 40 of contact 34a and forward detent 72 of channel 242. Thus, beam 204 on one side of channel 242 deflects with the same beam length as beam 120 on the other side of channel 242, with the effective beam length of beam 204 determined by the presence and location of bridging member 206.

As solder tail 40 of contact 34c is received in detent 74 of channel 242, beams 120 and 204 resile toward their unbiased or undeflected position to secure solder tail 40 of contact 34c in rear detent 74 of channel 242. A small lateral force may be maintained on solder tail 40 of contact 34c to assure that the solder tail is maintained in detent 74. Since the effective length of beam 204 that secures solder tail 40 of contact 34c in position is the same as the effective length of any beam 120 or 122 securing any of the solder tails of other contacts 34c in rearward detents 74 of channels 42a, the normal force applied by each beam holding each of the solder tails in a detent 74 in row 62 is substantially equal.

In this manner, bridge member 206 in slot 200 emulates the presence of a solder tail with respect to a rear solder tail in an adjacent channel being inserted and with respect to securing a solder tail in a rearward detent rearward of the bridge member 206 in an adjacent channel 242 in spacer plate 22 wherein the adjacent channel is adjacent to slot 200. Furthermore, the presence of bridging member 206 assures equal lateral normal force on each of the solder tails in a row of solder tails as retained in spacer plate 22.

While beam 204 has been described in the preferred embodiment as being bridged to flange 202 thereby interrupting slot 200, a protrusion extending from flange 202 toward beam 204 or a protrusion extending from beam 204 toward flange 202 or some combination thereof could provide the same function of emulating the presence of a contact to prevent substantial lateral movement of the beam due to the presence of the protrusion between beam 204 and flange 202.

Also as best seen in FIG. 2, spacer plate 22 has a slot 300 between the final lateral slot 42 and substantially rigid flange 302. The presence of endwall 298 integral with and extending perpendicular to flange 302 enhances the rigidity of flange 302. Slot 300 defines a beam 304 which may be either a beam 120 or a beam 122 as described above depending upon whether the channel adjacent to slot 300 is a channel 42a or a channel 42b. As shown in FIG. 2, channel 42a is adjacent to slot 300 thereby defining beam 304 having the characteristics of a beam 120. Absent slot 300, beam 304 would be a portion of flange 302 and would be, like flange 302, substantially rigid.

Beam 304 is bridged to flange 302 by bridging member 306 interrupting slot 300 into forward slot 308 and rear slot 310 as well as dividing beam 304 into forward beam 312 and rear beam 314. Bridging member 306 is positioned along slot 300 forward of rearward detent 74, that is spaced away from rear face 52 toward mating face 26, in the adjacent channel 42, laterally aligned with the rearward detent 74 in the channel 42 adjacent to the channel 42 adjacent to slot 300. For purposes of discussion, the channel 42 adjacent to slot 300 will be referred to as channel 342 and the channel 42 adjacent to channel 342 will be referred to as channel 344. Channel 342 is similar to channel 42b and channel 344 is similar to channel 42a. Thus, bridging member 306 is positioned along slot 300 forward of the rearward detent 74 in channel 342 and laterally aligned with rearward detent 74 in channel 344. In a preferred embodiment, bridging member 306 spans a distance along slot 300 that is substantially the thickness of a solder tail to be received in a detent in one of the channels. In a preferred embodiment, slot 300 extends into spacer plate 22 from rear face 52 substantially parallel to and substantially the same distance as slots 42. Beam 304 has the same mass as a beam 120 and in this manner will exhibit the same spring characteristics as beam 120 during insertion of solder tails 40 of contacts 34c and 34d into slot 342 and during retention of solder tails 40 of contacts 34c and 34d in detents 70 of slot 342.

During insertion of a solder tail 40 of contact 34b into slot 342, beam 120 functions as described above. While solder tail 40 is passing between tapered lead-in surfaces 144 and first region 148, beam 304, and more specifically rear beam 314, is resiliently deflected to the right with an effective beam length of length 176 due to beam 304 being bridged to flange 302 by bridging member 306. As solder tail 40 is received in rearward detent 74, rear beam 314 resiles returning toward its unbiased or undeflected position. As solder tail 40 is moved farther into channel 342 into and through second region 150 and first transition 152, rear beam 314 is again resiliently deflected to the right with an effective beam length of length 176 then resiles to its unbiased position. Note also that forward beam 312 may flex toward channel 342 as tail 40 is moved through second region 150 and first transition 152 since there is no solder tail in forward detent 72 of channel 342.

As solder tail 40 is moved farther into channel 342, solder tail 40 passes freely through third region 154.

As solder tail 40 enters and passes through second transition region 156 and fourth region 158 in channel 352, forward beam 312 resiliently bows into forward slot 308. Upon solder tail 40 of contact 34b moving into forward detent 72 in channel 342, forward beam 312 resiles toward its unbiased position to secure solder tail 40 in detent 72. A small lateral force may be maintained on solder tail 40 of contact 34b to assure that the solder tail is maintained in detent 70.

During insertion of solder tail 40 of contact 34d into channel 304, beam 120 on one side of channel 342 functions as described above and beam 304 on the other side of channel 342 functions like a beam 122 as described above due to solder tail 40 of contact 34c being present in rear detent 74 of channel 344, the design of beam 304 to have the same mass and spring characteristics of a beam 122 and the presence of and location of bridging member 306 in slot 300. As shown in FIG. 13, when solder tail 40 of a contact 34d is received between tapered lead-in surfaces 144 and passes through first region 148, beam 120 is resiliently deflected to the left with an effective beam length of length 176. Simultaneously, beam 304 is resiliently deflected to the right also with an effective beam length of length 176; forward beam 312 is effectively prevented from bowing due to the presence of solder tail 40 of contact 34b in forward detent 72 of channel 342. Thus, beam 304 on one side of channel 342 deflects with the same effective beam length as beam 122 on the other side of channel 342, with the effective length of beam 304 determined by the presence and location of bridging member 306. As solder tail 40 of contact 34d is received in rearward detents 74 of channel 342, beams 120 and 304 resile toward their unbiased or undeflected position to secure solder tail 40 of contact 34d in rear detent 74 of channel 342. A small lateral force may be maintained on solder tail 40 of contact 34d to assure the solder tail is maintained in detent 74. Since the effective length of beam 304 that secures solder tail 40 of contact 34d in detent 74 is the same as the effective length of any beam 120 or 122 securing any of the other solder tails of contacts 34d in a rearward detent of a channel 42b, the normal force applied by each beam holding each of the solder tails in a rearward detent is substantially equal.

In this manner, bridge member 306 in slot 300 emulates the presence of a solder tail with respect to securing a solder tail in a rearward detent, rearwardly of bridging member 306, in a channel of spacer plate 22 adjacent to slot 300. Furthermore, the presence of bridging member 306 assures equal lateral normal force on each of the solder tails in a row of solder tails as retained in spacer plate 22.

While beam 304 has been described in the preferred embodiment as being bridged to flange 302 thereby interrupting slot 300, a protrusion extending from flange 302 toward beam 304 or a protrusion extending from beam 304 toward flange 302 or some combination thereof could provide the same function of emulating the presence of a contact to prevent substantial lateral movement of the beam due to the presence of the protrusion between beam 304 and flange 302.

Beams 204 and 304 have been described as having the same mass as a beam 120 or 122 which they represent in the spacer plate. While beams 204 and 304 in the preferred embodiment do not have the profile of beams 120 or 122 on the side thereof that forms slot 200 or 300, they could have such a profile and thereby be assured to have the same mass and spring characteristics as beams 120 or 122. To obtain the same mass, the sidewall of the slot forming the beam 204 or 304 is shifted until the mass of the respective beam 204 or 304 equals the mass of a beam 120 or 122 which they represent.

Figure 14:
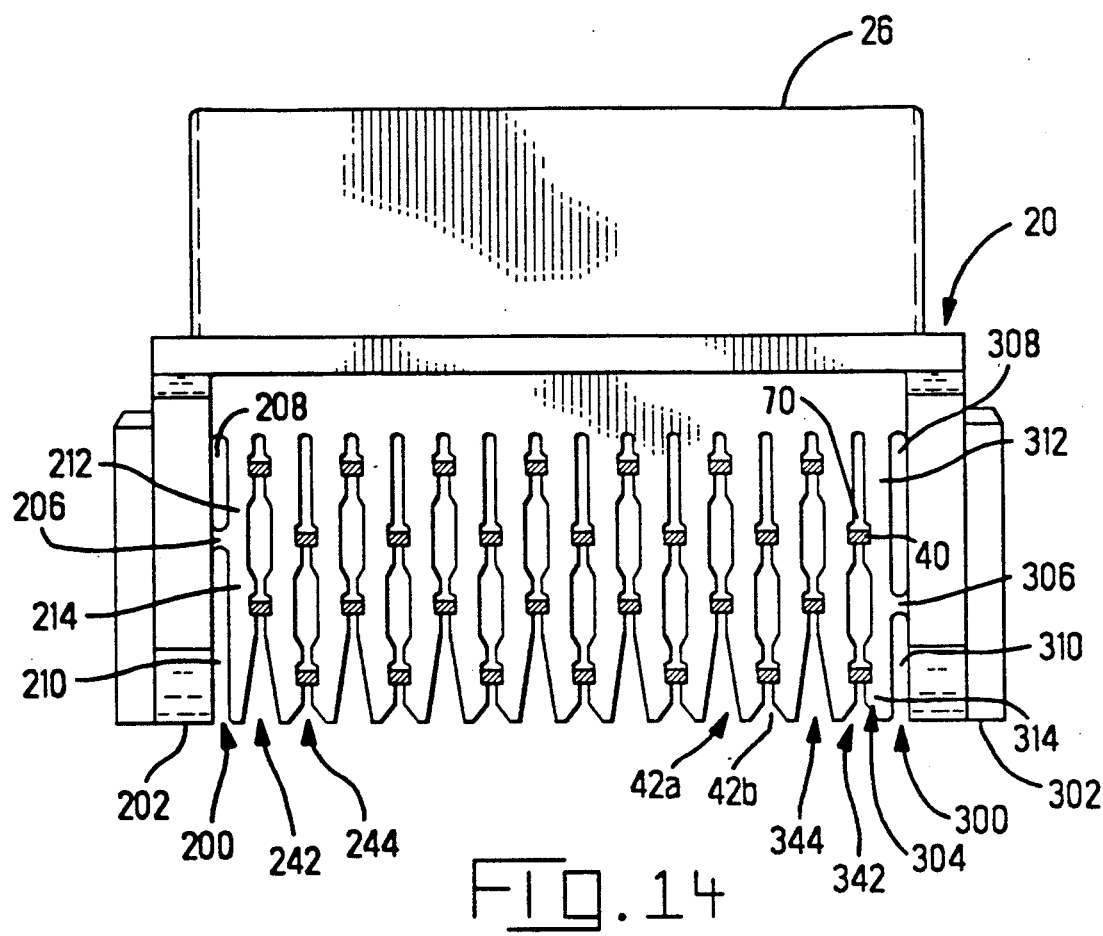
FIG. 14 is a top view of the spacer plate with all four rows of solder tails received in detents.

FIG. 14 shows a top view of a connector having all of the contact solder tails (shown in cross section) received in spacer plate 22.

Figure 15:
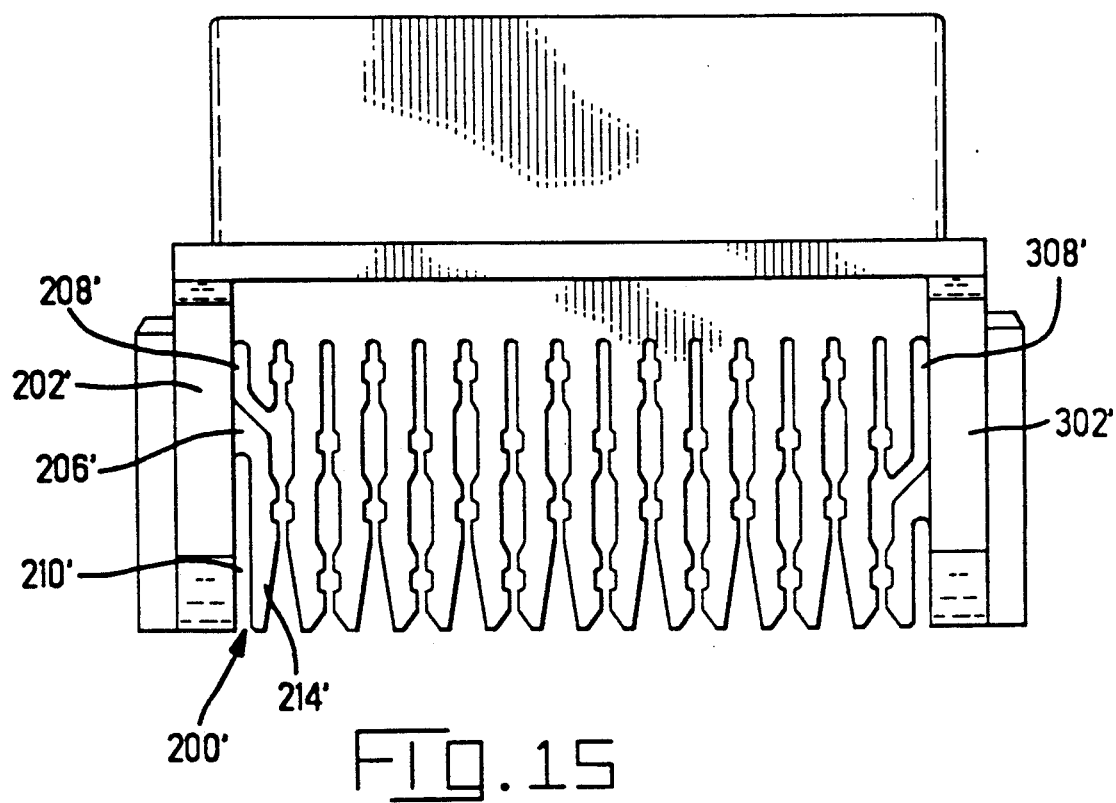
FIG. 15 is an alternate embodiment of the spacer plate of the present invention.

FIG. 15 shows a top view of a connector 20' similar to FIG. 2 having an alternate embodiment spacer plate 22'. Slot 200' is interrupted forming forward slot 208' and rearward slot 210' by bridging member 206' which bridges rearward beam 214' to flange 202'. In this alternate embodiment, forward beam 212' is not integral with rearward beam 214'. Similarly, FIG. 15 shows slot 300' as being interrupted forming forward slot 308' and rearward slot 310' by bridging member 306' which bridges rearward beam 314' to flange 302'. In this alternate embodiment, forward beam 312' is not integral with rearward beam 314'.

While the invention has been described with respect to a connector having solder tails to be received in plated through holes in a circuit board on which the connector is mounted, the invention could be employed in a surface mount connector wherein the solder tails extend to land on the side of the circuit board on which the connector is mounted.

What is claimed is:

1. An electrical connector, comprising:
   a dielectric housing having a mating face and a rear housing face with a plurality of contact receiving passages extending therebetween;
   a spacer plate extending rearwardly from proximate said rear housing face to a rear face and extending laterally between first and second flanges, said spacer plate having a plurality of channels extending forward from said rear face toward said rear housing face for receiving a solder tail of a contact, said channels defining therebetween beams having recesses in sidewalls thereof which define detents for seating a solder tail, each of said channels having at least one detent therein;
   a plurality of contacts secured in said housing, each of said contacts having a mating portion received in one of said contact receiving passages and a solder tail formed to be received in a corresponding channel in said spacer plate; and
   a first slot between said first flange and a first channel adjacent thereto, said first slot extending substantially parallel to said first channel, said first slot interrupted by a first bridging member between said first flange and a first beam between said first slot and said first channel, said first bridging member positioned along said first slot forward of a detent in said first channel and laterally aligned with a detent in a second channel, whereby said slot is divided into at least two segments, one segment extending rearward from said bridging member and the other segment extending forward from said bridging member.

2. An electrical connector as recited in claim 1, further comprising:
   a second slot between said second flange and a third channel adjacent thereto, said second slot extending substantially parallel to said third channel, said second slot interrupted by a second bridging member between said second flange and a second beam between said second slot and said third channel, said second bridging member positioned along said second slot forward of a detent in said third channel and laterally aligned with a detent in a fourth channel, said fourth channel adjacent to said third channel.

3. An electrical connector as recited in claim 1, wherein a majority of the channels in the spacer plate extend substantially the same depth into the spacer plate from said rear face.

4. An electrical connector as recited in claim 2, wherein at least one of said first and second slots extends into the spacer plate from said rear face.

5. An electrical connector as recited in claim 1, wherein said first channel has at least two spaced detents therealong and said detent in said first channel is the detent closer to said rear face.

6. An electrical connector as recited in claim 1, wherein said second channel has at least two spaced detents therealong, said detent in said second channel is the detent closer to said rear face.

7. An electrical connector as recited in claim 1, wherein said second channel has at least two spaced detents therealong, said detent in said second channel is not the detent closer to said rear face.

8. An electrical connector as recited in claim 1, further comprising means for providing shielding.

9. An electrical connector as recited in claim 1, wherein the spacer plate is integral with the dielectric housing.

10. An electrical connector as recited in claim 1, wherein the slot extends to the same depth from said rear face as said first channel.

11. An electrical connector, comprising:

a dielectric housing having a mating face and a rear housing face with a plurality of contact receiving passages extending therebetween;

a spacer plate extending rearwardly from proximate said rear housing face to a rear face and extending laterally from a first flange, said spacer plate having at least first and second channels extending forward from said rear face toward said rear housing face for receiving a solder tail of a contact, said at least first and second channels defining therebetween beams having recesses in sidewalls thereof which define detents for seating a solder tail, each of said first and second channels having at least one detent therein;

a plurality of contacts secured in said housing, each of said contacts having a mating portion received in one of said contact receiving passages and a solder tail formed to be received in a corresponding channel in said spacer plate; and a slot between said first flange and said first channel, said slot extending substantially parallel to said first channel, said slot interrupted by a protrusion extending thereinto, said protrusion positioned along said slot forward of a detent in said first channel and laterally aligned with a detent in said second channel, whereby said slot is divided into at least two segments, one segment extending rearward from said protrusion and the other segment extending forward from said protrusion.

12. An electrical connector as recited in claim 11, wherein the protrusion extends from a beam defining a side of the slot.

13. An electrical connector as recited in claim 11, wherein the protrusion extends from said flange.

14. An electrical connector as recited in claim 11, wherein the protrusion comprises a bridging member between said flange and a beam between said slot and said first channel.

15. An electrical connector as recited in claim 11, wherein a majority of the channels in the spacer plate extend substantially the same depth into the spacer plate from said rear face.

16. An electrical connector as recited in claim 11, wherein said slot extends into the spacer plate from said rear face.

17. An electrical connector as recited in claim 11, wherein said second channel is adjacent to said first channel.

18. An electrical connector as recited in claim 11, wherein said first channel has at least two spaced detents therealong and said detent in said first channel is the detent closer to said rear face.

19. An electrical connector as recited in claim 11, wherein said second channel has at least two spaced detents therealong, said detent in said second channel is the detent closer to said rear face.

20. An electrical connector as recited in claim 11, wherein said second channel has at least two spaced detents therealong, said detent in said second channel is the detent more distantly spaced from said rear face.

21. An electrical connector as recited in claim 11, further comprising means for providing shielding.

22. An electrical connector as recited in claim 11, wherein the spacer plate is integral with the dielectric housing.

23. An electrical connector as recited in claim 11, wherein the slot extends to the same depth from the rear face as said first channel.

24. An electrical connector, comprising:

a dielectric housing having a mating face and a rear housing face with a plurality of contact receiving passages extending therebetween;

a spacer plate extending rearwardly from proximate said rear housing face to a rear face and extending laterally from a flange, said spacer plate having at least one channel extending forward from said rear face toward said rear housing face for receiving a solder tail of a contact;

at least one contact secured in said housing, each of said at least one contact having a mating portion received in one of said contact receiving passages and a solder tail formed to be received in a corresponding one of said at least one channels in said spacer plate; and a slot between said flange and said at least one channel, said slot extending substantially parallel to said at least one channel, said slot interrupted by a protrusion extending thereinto, whereby the slot is divided into at least two segments, one segment extending rearward from said protrusion and the other segment extending forward from said protrusion.

25. An electrical connector as recited in claim 24, wherein the protrusion extends from a beam defining a side of the slot.

26. An electrical connector as recited in claim 24, wherein the protrusion extends from said flange.

27. An electrical connector as recited in claim 24, wherein the protrusion comprises a bridging member between said flange and a beam between said slot and said at least one channel.

28. An electrical connector as recited in claim 24, wherein said slot extends into the spacer plate from said rear face.

29. An electrical connector as recited in claim 24, wherein the slot extends forwardly into the spacer plate from the rear face to the same depth as said at least one channel.

30. An electrical connector as recited in claim 24, further comprising at least one detent in sidewalls of said at least one channel.

* * * * *

UNITED STATES PATENT AND TRADEMARK OFFICE
CERTIFICATE OF CORRECTION

PATENT NO. : 5,037,334

DATED : August 6, 1991

INVENTOR(S) : Michael A. Viselli, et al

It is certified that error appears in the above-identified patent and that said Letters Patent is hereby corrected as shown below:

On the title page, change the name of the Assignee from "AMP Corporated" to -- AMP Incorporated--.

Signed and Sealed this

Fourteenth Day of January, 1992

Attest:

HARRY F. MANBECK, JR.

*Attesting Officer*   *Commissioner of Patents and Trademarks*